United States Patent [19]

Matsuda et al.

[11] Patent Number: 4,816,369

[45] Date of Patent: Mar. 28, 1989

[54] STIMULABLE PHOSPHOR SHEET AND METHOD OF CONVEYING THE SAME

[75] Inventors: Terumi Matsuda; Shumpeita Torii, both of Ashigara, Japan

[73] Assignee: Fuji Photo Film, Co., Ltd., Japan

[21] Appl. No.: 3,300

[22] Filed: Jan. 14, 1987

Related U.S. Application Data

[62] Division of Ser. No. 760,415, Jul. 30, 1985, Pat. No. 4,665,003.

[30] Foreign Application Priority Data

Jul. 31, 1984 [JP] Japan ................................ 59-163365
Jul. 31, 1984 [JP] Japan ................................ 59-163366

[51] Int. Cl.[4] .......................... G03F 9/00; G03C 5/16; G01T 1/11; G09K 11/08

[52] U.S. Cl. ................................ 430/139; 250/327.2; 250/337; 250/484.1 R; 250/301; 430/6

[58] Field of Search ................. 430/139, 6; 250/327.2, 250/484.1, 337, 484, 301.4 R, 301.6 R

[56] References Cited

U.S. PATENT DOCUMENTS

| | | | |
|---|---|---|---|
| 3,933,488 | 6/1976 | Noguchi et al. | 430/139 |
| 4,379,070 | 4/1983 | Tick | 430/139 |
| 4,507,379 | 3/1985 | Tusuchino et al. | 430/139 |
| 4,590,381 | 5/1986 | Mendelson | 430/139 |
| 4,665,003 | 5/1987 | Matsuda et al. | 430/139 |
| 4,675,271 | 6/1987 | Degenhardt | 430/139 |
| 4,684,592 | 8/1987 | Matsuda et al. | 430/139 |

*Primary Examiner*—Mukund J. Shah
*Attorney, Agent, or Firm*—Gerald J. Ferguson, Jr.

[57] ABSTRACT

In a stimulable phosphor sheet comprising a support, a phosphor layer containing a stimulable phosphor and a binder, and a protective film superposed in this order, the improvement in which at least the front end of the phosphor sheet is provided with a stiff reinforcing member extending along said end: or the improvement in which at least a portion on the back surface adjoining the front end of the phosphor sheet is provided with a stiff reinforcing member extending in the width direction.

11 Claims, 3 Drawing Sheets

FIG. 3-A

STIMULABLE PHOSPHOR SHEET AND METHOD OF CONVEYING THE SAME

This is a divisional application of Ser. No. 760,415, filed July 30, 1985, now U.S. Pat. No. 4,665,003.

BACKGROUND OF THE INVENTION

1. Field of the Invention

The present invention relates to a stimulable phosphor sheet employable in a radiation image recording and reproducing method utilizing a stimulable phosphor, and a method of conveying the stimulable phosphor sheet.

2. Description of Prior Arts

For obtaining a radiation image, there has been conventionally employed a radiography utilizing a combination of a radiographic film having a sensitive silver salt material layer and an intensifying screen.

As a method replacing the above-mentioned conventional radiography, a radiation image recording and reproducing method utilizing a stimulable phosphor as described, for instance, in U.S. Pat. No. 4,239,968, has been developed and paid much attention. The method involves steps of causing a stimulable phosphor to absorb a radiation having passed through an object or having radiated from an object; sequentially exciting (or scanning) the phosphor with an electromagnetic wave such as visible light or infrared rays (i.e., stimulating rays) to release the radiation energy stored in the phosphor as light emission (i.e., stimulated emission); photoelectrically detecting the emitted light to obtain electric signals; and reproducing the radiation image of the object as a visible image, numerals, symbols, etc. from the electric signals.

In the radiation image recording and reproducing method, a radiation image is obtainable with a sufficient amount of information by applying a radiation to the object at a considerably smaller dose, as compared with the conventional radiography. Accordingly, the radiation image recording and reproducing method is of great value, especially when the method is used for medical diagnosis.

In performing the radiation image recording and reproducing method, a stimulable phosphor is generally employed in the form of a stimulable phosphor sheet (also referred to as a radiation image storage panel, and generally in the form of a sheet of rectangle, square, etc.) which comprises a support and a phosphor layer provided thereon. The phosphor layer comprises a stimulable phosphor and a binder. Further, a protective film made of a transparent plastic film is provided on the surface of the phosphor layer to protect the phosphor layer from physical and chemical deterioration.

The stimulable phosphor sheet does not serve to finally record image information, but only stores the information temporarily to provide the image or the like on an independently prepared final recording medium as described above. Accordingly, the stimulable phosphor sheet can be repeatedly used and such repeated use brings about economical advantage.

The repeated use of the stimulable phosphor sheet is particularly advantageous, for instance, in the case that a radiation image information recording and reading device employing the stimulable phosphor sheet is mounted on a traveling station such as a radiographic apparatus-carrying car to conduct mass radiographic examination in various places. More in detail, it is inconvenient to carry a great number of stimulable phosphor sheets on a traveling station, and there is a limitation on the number of sheets capable of being carried on a car such as a radiographic apparatus-carrying car. Accordingly, it is practically useful that the stimulable phosphor sheets are mounted on a radiographic car under such conditions that the stimulable phosphor sheets are repeatedly used; radiation image information of an object is recorded on each stimulable phosphor sheet and read out to obtain image information as a signal; and the obtained signal is transferred to a recording medium having a great recording capacity such as a magnetic tape so as to repeatedly use the stimulable phosphor sheet in cycle. This means that radiation images of a number of objects can be obtained by the use of a small number of stimulable phosphor sheets. Further, the combination of the repeated use of the stimulable phosphor sheets with a continuous radiographic process enables to perform rapid radiography in the mass radiographic examinations. This combination is of great value in practical use.

In the case of using the stimulable phosphor sheets repeatedly in cycle, after the radiation energy stored in the stimulable phosphor sheet is read out and aimed image information is obtained, the remaining energy in the sheet is released and erased in a manner as disclosed, for instance, in Japanese Patent Provisional Publications No. 56(1981)-11392 and 56(1981)-12599. By employing such manner, the stimulable phosphor sheet can be efficiently and repeatedly used in cycle.

Thus, the radiation image information recording and reading device, in one aspect, is desirably mounted on a traveling station such as a radiographic apparatus-carrying car in the form of a united built-in device which comprises an image recording means for exposing a stimulable phosphor sheet to a radiation having passed through an object so as to record and store a radiation image in the stimulable phosphor sheet, a read-out means for reading out the radiation image stored in the stimulable phosphor sheet, an erasure means for releasing and erasing radiation energy remaining in the stimulable phosphor sheet for the next use of the stimulable phosphor sheet, and a conveyance means for moving the stimulable phosphor sheet in cycle to each of the above-mentioned means. The radiation image information recording and reading device having the above-mentioned constitution have various advantages not only in its installation in the traveling station such as a radiographic apparatus-carrying car but also in setting in hospitals, so that the above device is convenient in practical use.

The radiation image information recording and reading device utilizing the above-mentioned system of repeatedly and cyclically using the stimulable phosphor sheet is disclosed in Japanese Patent Application No. 58(1983)-66730 filed in the present assignee. In the device, the stimulable phosphor sheet is occasionally conveyed vertically or almost vertically for the purpose of making the device compact.

If a stimulable phosphor sheet suffers physical deterioration such as a scratch on the surface of the protective film, the quality of image or the accuracy of image information provided by the phosphor sheet tends to decrease markedly. For this reason, it is necessary to select the means for conveying a stimulable phosphor sheet with such a careful consideration that the surface of the stimulable phosphor sheet should not be damaged. From this viewpoint, as a means for conveying a stimulable phosphor sheet, a belt conveyor made of a soft sheet-material is generally employed. However, while the belt conveyor is suitable for conveying the stimulable phosphor sheet horizontally, it is unsuitable for conveying the stimulable phosphor sheet in the direction other than the horizontal direction. More in detail, in the process for conveying a stimulable phosphor sheet vertically or almost vertically using a belt conveyor, it is necessary to arrange a pair of belt conveyors in such a manner that the belt conveyors are in face to face contact with each other so as to convey the stimulable phosphor sheet under the condition that the stimulable phosphor sheet is sandwiched between that pair of belt conveyors. However, said conveying device is complicated in structure, and it is difficult to make the device compact. Further, there are other problems such that the surface of the stimulable phosphor sheet tends to suffer scratches when the rate of one belt conveyor is made different from that of the other, even if the difference therebetween is very small.

SUMMARY OF THE INVENTION

The present invention provides a stimulable phosphor sheet suitably employable in the radiation image information recording and reading device in which the stimulable phosphor sheet is mechanically conveyed in cycle, and particularly advantageously employable in the the radiation image information recording and reading device in which the stimulable phosphor sheet is mechanically conveyed in the vertical or almost vertical direction in cycle.

In another aspect, the present invention provides a method of conveying the stimulable phosphor sheet with almost no troubles.

The present invention provides, in one aspect, a stimulable phosphor sheet comprising a support, a phosphor layer containing a stimulable phosphor and a binder, and a protective film superposed in this order, which is improved in that at least the front end of the phosphor sheet is provided with a stiff reinforcing member extending along said end.

The present invention provides, in another aspect, a stimulable phosphor sheet comprising a support, a phosphor layer containing a stimulable phosphor and a binder, and a protective film superposed in this order, which is improved in that at least a portion on the back surface adjoining the front end of the phosphor sheet is provided with a stiff reinforcing member extending in the width direction.

In the present specification, the front end and the rear end are both named with reference to the conveying direction.

The above-mentioned specifically formulated stimulable phosphor can be advantageously conveyed by a method which comprises applying a driving force to a surface of the stimulable phosphor sheet by means of a driving member, keeping both side edges of said phosphor sheet by means of a guiding member to move the stimulable phosphor sheet in a given direction.

DETAILED DESCRIPTION OF THE INVENTION

The present invention will be described more in detail hereinafter referring to the accompanying drawings.

The general constitution of the conventional stimulable phosphor sheet is well known. The stimulable phosphor sheet is generally employed, as described above, in the form of a sheet comprising a support and a phosphor layer provided thereon which comprises a stimulable phosphor and a binder. On the surface of the phosphor layer is provided a protective film of transparent plastic material, because the phosphor layer is easily affected by physical shocks.

Figure 1:
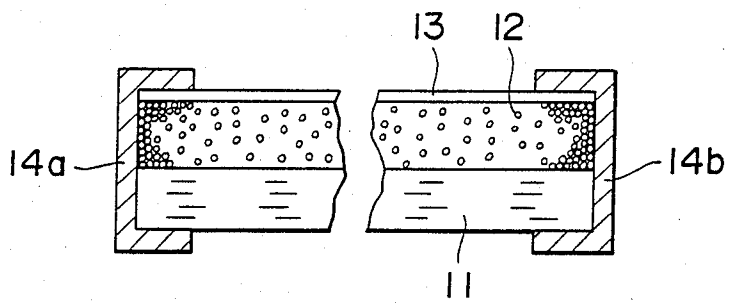
FIGS. 1 and 2 are schematic views illustrating the constitutions of embodiments of the stimulable phosphor sheet of the invention.
Figure 2:
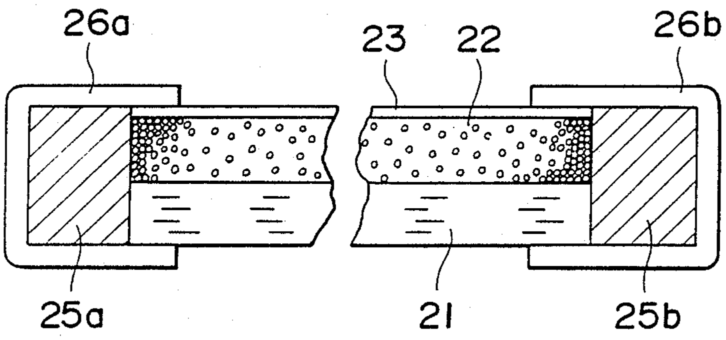
Figure 3:
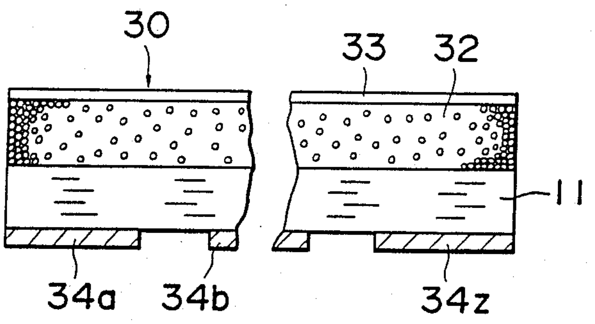
FIG. 3 is a schematic view illustrating the constitution of an embodiment of the stimulable phosphor sheet of the invention, and FIG. 3-A is a perspective view of the stimulable phosphor sheet of FIG. 3.
Figure 3:
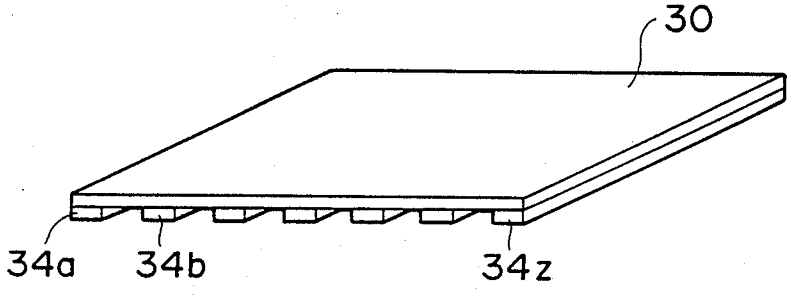

FIGS. 1, 2 and 3 schematically illustrate the constitutions of the stimulable phosphor sheet of the invention.

In the figures, the stimulable phosphor sheet comprises an elemental structure of a support 11, 21, 31, a phosphor layer 12, 22, 33 and a protective film 13, 23, 33.

Examples of the support material include plastic films such as films of cellulose acetate and polyethylene terephthalate, metal sheets such as aluminum foil, ordinary papers, baryta paper, and resin-coated papers. On the surface of the support (phosphor layer-side surface of the support) may be provided other functional layers such as an adhesive layer, a light-reflecting layer and a light-absorbing layer.

The phosphor layer essentially comprises stimulable phosphor particles dispersed in a binder. A great number of stimulable phosphors are known. The stimulable phosphor employed in the invention can be selected from the known stimulable phosphors. Examples of the known stimulable phosphors. Examples of the known stimulable phosphor include a divalent europium activated alkaline earth metal fluorohalide phosphor ($M^{II}FX:Eu^{2+}$, in which $M^{II}$ is at least one alkaline earth metal selected from the group consisting of Mg, Ca and Ba; and X is at least one halogen selected from the group consisting of Cl, Br, and I); an europium and samarium activated strontium sulfide phosphor (SrS:Eu,Sm); an europium and samarium activated lanthanum oxysulfide phosphor ($La_2O_2S$: Eu,Sm); an europium activated barium aluminate phosphor ($BaO \cdot Al_2O_3$:Eu); an europium activated alkaline earth metal silicate phosphor ($M^{2+}O \cdot SiO_2$:Eu, in which $M^{2+}$ is at least one alkaline earth metal selected from the group consisting of Mg, Ca and Ba); a cerium activated rare earth oxyhalide phosphor (LnOX:Ce, in which Ln is at least one rare earth element seletected from the group consisting of La, Y, Gd and Lu; and X is at least one halogen selected from the group consisting of Cl, Br and I) and the like.

A transparent protective film is then provided on the surface of the phosphor layer to physically and chemically protect the phosphor layer. Examples of the material employable for the preparation of the transparent protective film include cellulose acetate, polymethyl methacrylate, polyethylene terephthalate and polyethylene. The transparent protective film generally has a thickness within the range of approx. 0.1–20 um.

The stimulable phosphor sheet can be colored with an appropriate colorant as described in U.S. Pat. No. 4,394,581 and U.S. patent application Ser. No. 326,642.

Further, white powder may be dispersed in the phosphor layer as described in U.S. Pat. No. 4,350,893.

In FIG. 1, the stimulable phosphor sheet is provided on the front and rear ends thereof with stiff reinforcing members 14*a*, 14*b*, which extend along the respective ends. In other words, the reinforcing members extend vertically to the plane of the attached drawing. The reinforcing member is preferably provided to the end in such manner that the member covers a whole surface of said end.

In FIG. 2, the stimulable phosphor sheet is provided on the front and rear ends thereof with stiff reinforcing members 25*a*, 25*b*, which extend along the respective ends. The reinforcing members are preferably covered with polymer coating layers 26*a*, 26*b*.

In FIG. 3 and FIG. 3-A, portions on the back surface adjoining the front and rear ends, as well as intermediate portions on the back surface of the phosphor sheet are provided with stiff reinforcing members 34*a*, 34*b*, . . . , 34*z*, extending in the width direction. In this embodiment, "a portion adjoining the front end" and other related expressions are not used to restrict the portion which directly adjoins the front end, and are used to include a portion which adjoins the front end with some space, for instance, up to a few cm such as up to 5 cm.

The stiff reinforcing member can be in the form of a bar, a belt, or a stick and can be made of a metallic material or a stiff carbonaceous material.

Examples of the metallic material include aluminum, copper, and steel. Examples of the stiff carbonaceous material include carbon fiber and silicon carbide fiber. Preferably employed are highly self-supporting material such as steel, carbon fibers and silicon carbide fibers.

Examples of the material of the polymer coating layers include those previously mentioned as materials of the protective film. For example, cellulose acetate, polymethyl methacrylate, polyethylene terephthalate and polyethylene can be mentioned.

The polymer coating layer can be formed by fixing a polymer film over the reinforcing member. Otherwise, a film-forming polymer solution can be applied over the reinforcing member and dried to give the coating layer.

The front and/or rear ends of the support of the stimulable phosphor sheet can be chamferred on the bottom surface.

The stimulable phosphor sheet of the invention as reinforced in the above-described manner at least at the front end or at least at a portion on the back surface adjoining the front end is resistant to physical shock or other physical pressure. Accordingly, thus reinforced stimulable phosphor sheet is hardly damaged or deteriorated under physical contact with members in a conveying device.

Moreover, the stimulable phosphor sheet reinforced as above is advantageously employed in a vertical conveying method such as a method which comprises applying a driving force to a surface of the stimulable phosphor sheet by means of a driving member, keeping both side edges of said phosphor sheet by means of a guiding member to move the stimulable phosphor sheet in a given direction. Details of this method shall be described hereinafter. The stimulable phosphor sheet of the invention hardly shows, at least at the front end, unfavorable deformation such as bending or flexure. Therefore, the front end of the stimulable phosphor sheet is easily and smoothly engaged with a driving member of a conveying device such as a couple of rollers associated with each other, and no trouble takes place in the virtically conveying stage. Thus, the repeated use of the stimulable phosphor sheet in cycle is satisfactorily accomplished with substantially no trouble.

In some conveying devices, the stimulable phosphor sheet may not run in one direction. For instance, the stimulable phosphor sheet may be moved in an adverse direction in a certain stage of the conveying process. In that case, the provision of the stiff reinforcing member to the rear end or to its near portion is effective to avoid suffering damage or physical deterioration in the contact with a conveying member.

In addition, both sides of the stimulable phosphor sheet to be employed in the conveying method of the invention are preferably formed or processed to have enhanced protected against the physical(mechanical) shock given to these sides by the side-guiding means in the course of the conveying stage, as well as enhanced protection against chemical deterioration.

For instance, both sides are protected by a polymer coating layer.

The polymer coating layer can be provided to the side of the stimulable phosphor sheet, for instance, by applying a solution of a film-forming polymer in a solvent to the side and then drying to remove the solvent, or applying reactive material(s) to form a polymer material to the side and causing the reaction to form in-situ the polymer coating film. There is no specific limitation on the film-forming polymer employed in the above process. For instance, a polyurethane, an acrylic resin and a mixture of an acrylic resin and vinyl chloridevinyl acetate copolymer (which is disclosed in Japanese Patent Provisional Publication No. 58(1983)-68746) can be used.

The polymer coating layer can be formed by means of a polymer film. The polymer film can be produced from the same material as that employed for the production of the protective film. The polymer film employed for this purpose may be transparent or not. The film can be fixed to the side, for instance, by an adhesive or other sticky material.

Figure 4:
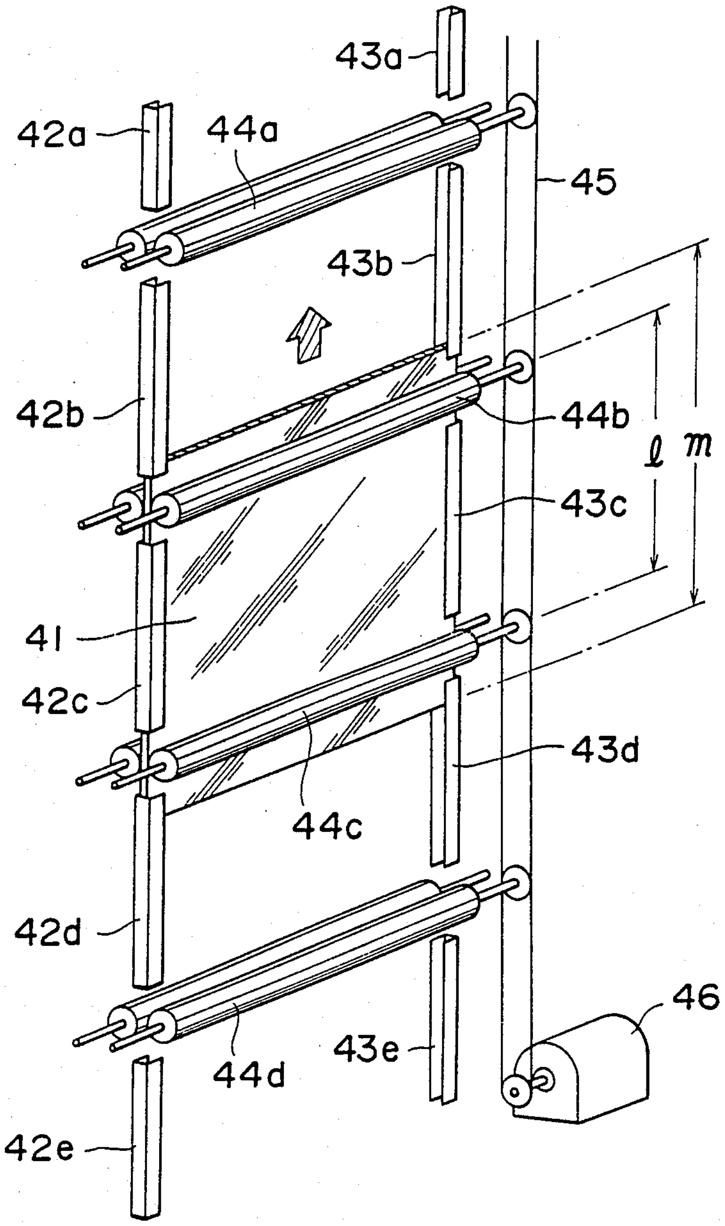
FIG. 4 is a schematic view illustrating the constitution of the device preferably employed in the method of conveying a stimulable phosphor sheet according to the present invention.

FIGS. 4 is a schematic view of the conveying device which is preferably employed in the method of conveying the stimulable phosphor sheet according to the present invention. The method of conveying a stimulable phosphor sheet of the invention is described hereinafter.

The conveying device preferably used in the method of conveying a stimulable phosphor sheet according to the invention is a device basically comprising guiding members 42 and 43 (42*a*, 43*a*, 42*b*, 43*b*, . . . ) for keeping both sides of a stimulable phosphor sheet 41, and two or more driving members 44 (44*a*, 44*b*, 44*c*, . . . ) arranged along the conveying direction (direction along the indicated arrow) for providing a driving force on both surfaces of the stimulable phosphor sheet 41, in which the distance between said two driving members which adjoin each other along the conveying direction (e.g., 44*b* and 44*c*) is smaller than the length of the stimulable phosphor sheet measured in the conveying direction.

The guiding members of the device according to the invention keep the stimulable phosphor sheet at the both sides thereof. The guiding members prevent the sheet from bending in the vertical direction against the surface plane of the sheet (namely, flexure) and from moving laterally. The guiding member is, for instance, U-shaped in the section. Accordingly, the guiding member is not necessarily in contact with the stimulable phosphor sheet to keep it. As is evident from FIG. 4, between the two driving members 44, the surface of the sheet on which the radiation image is stored and recorded is kept being from contact with members of the device, since the stimulable phosphor sheet 41 is kept by the guiding members 42 and 43 at both sides of the sheet which do not participate in storing and recording the radiation image. Accordingly, the surface of the sheet is hardly damaged. The shape of the guiding member is not restricted to one as shown in FIG. 4, and any shape can be optionally used, as far as the guiding member has the above-described functions. Further, there is no specific limitation on the material of the guiding member. The guiding member is not necessarily employed in the form of individually separated member as shown in FIG. 4, and a united guiding member, for instance, a member in which one guiding member 42 is combined with another guiding member 43 on the back surface-side of the stimulable phosphor sheet 41 (support side-surface of the sheet) in FIG. 4, can be employed with appropriate selection of the driving members as described hereinafter.

The driving members of the conveying device of the present invention give a driving force to the surface(s) of the stimulable phosphor sheet, and make it possible to convey (i.e., move) the stimulable phosphor sheet in a given direction. The driving members comprises at least two members, and the distance (l) between the two driving members which are adjacent to each other along the conveying direction is smaller than the length (m) of the stimulable phosphor sheet in the conveying direction. Two or more driving members having the above-described constitution can convey the stimulable phosphor sheet with little error.

Representative examples of the driving member for providing a driving force on the surfaces of the stimulable phosphor sheet are a driving member comprising a pair of rollers as shown in FIG. 4. The length of the roller is preferably as almost the same as width of the stimulable phosphor sheet (the length measured in the lateral direction), but the length of the roller is not restricted to the above-mentioned length. The roller may comprise a plurality of short rollers. The driving member may not consist of a pair of rollers, and for example, a driving member comprising a driving roller and a fixed supporting member which is associated with the roller is employable. Further, other driving members than the above-mentioned rollers can be employed in the invention.

The surface of the driving member, especially the surface thereof which are to be in contact with the surface of the stimulable phosphor sheet, are preferably formed by a soft and elastic material such as rubber. By employing a driving member having a surface of such material, the surface of the stimulable phosphor sheet can be protected from physical shock so as not to be damaged.

The driving force is generally supplied to the driving members 44 (44*a*, 44*b*, 44*c*, . . .) for means 46 such as a motor through a driving power-transmitting means 45 such as a chain and a belt. This driving force is then supplied to the stimulable phosphor sheet 41 under rotation via surfaces thereof.

The guiding member and driving members are supported by an appropriate means such as a fixing means or a supporting means so as to fulfill each function in the area.

In the method of conveying a stimulable phosphor sheet according to the present invention, the stimulable phosphor sheet can be easily and reliably conveyed in directions other than horizontal direction, particularly in the vertical or almost vertical direction (upward and/or downward conveying), without damaging the surfaces of the sheet. The vertical or almost vertical conveyance giving no damage to the surface of stimulable phosphor sheet has been hardly attained in the conventional method using a belt conveyor. The method of conveying the stimulable phosphor sheet of the invention can be effectively used not only in the conveyance of a stimulable phosphor sheet in the vertical or almost vertical direction but also in the conveyance with alteration of the direction (e.g. L-turn and U-turn). Further, the method of the invention, can be effectively employed in the conveyance of a stimulable phosphor sheet in the horizontal direction. A belt conveyor is conventionally used in the conveyance thereof in such direction. Furthermore, the method of the present invention can be employed in combination with a conventional method using a belt conveyor in conveying the stimulable phosphor sheet in a radiation image information recording and reading device.

The device is preferably provided with a guiding means for guiding the front end of the stimulable phosphor sheet. The guiding means is arranged in the vicinity of the driving means, for instance, just in front of the driving means. The guiding means serves to smoothly engage the coming stimulable phosphor sheet with the driving means. Although the stimulable phosphor sheet essentially comprising a support and a phosphor layer is considerably stiff, flexure may occasionally happen on most of the conventional stimulable phosphor sheet used in a relatively thin plate having a width of approx. 30–60 cm at the front end. If flexure takes place at the front end of the stimulable phosphor sheet, the front end sometimes suffers damage, or in the worst case, the conveying action is stopped by unsuitable engagement between the sheet and the driving means. The guiding means for guiding the front end of the stimulable phosphor sheet is very effective to enable smooth engagement between the stimulable phosphor sheet and the driving means.

There is no specific limitation on the shape, size, and location of the front end-guiding means, as far as it serves to enable the smooth engagement. For instance, the guiding means is in the form of eaves or skirts extending from an area where both driving rollers are in contact with each other. Otherwise, the front endguiding means can be in the form of a roller arranged in the vicinity of the driving means. The front end-guiding means can be arrange merely on one side of the conveyor. The front end-guiding means is generally made of plastic material, metal, or a composite material of plastic material and metal.

As described above, the method of the invention is suitable for conveying a stimulable phosphor sheet in the vertical or almost vertical direction. Accordingly, from the viewpoint of making the device compact, the method of the invention can be preferably and practically employed in the radiation image information recording and reading device in which the stimulable phosphor sheet is required to be conveyed in such direction so as to be repeatedly used in cycle.

We claim:

1. In a stimulable phosphor sheet comprising:

a support layer;

a protective film layer; and a phosphor layer containing a stimulable phosphor and a binder;

wherein all of said layers are united together, with said phosphor layer being interposed between said support layer and said protective film layer;

the improvement wherein at least a front end of said phosphor sheet is provided with a self-supporting stiff reinforcing member extending along said front end for retarding flexing of said phosphor sheet.

2. The stimulable phosphor sheet as claimed in claim 1, wherein said front end and an end opposite said front end are each provided with a self-supporting stiff reinforcing member extending along said respective ends.

3. The stimulable phosphor sheet as claimed in claim 1 or 2, wherein each said reinforcing member covers the whole surface of each corresponding said end.

4. The stimulable phosphor sheet as claimed in claim 1 or 2, wherein each said reinforcing member is made of a metallic material.

5. The stimulable phosphor sheet as claimed in claim 1 or 2, wherein each said reinforcing member is made of a stiff carbonaceous material.

6. The stimulable phosphor sheet as claimed in claim 1 or 2, wherein each said reinforcing member is covered with a polymer coating layer.

7. In a stimulable phosphor sheet comprising:

a support layer;

a protective film layer; and a phosphor layer containing a stimulable phosphor and a binder;

wherein all of said layers are united together, with said phosphor layer being interposed between said support layer and said protective film layer;

the improvement wherein at least a portion of an exterior surface of said support layer adjoining a front end of said phosphor sheet is provided with a self-supporting stiff reinforcing member in the form of a bar, belt or rod extending substantially parallel to said front end for retarding flexing of said phosphor sheet.

8. The stimulable phosphor sheet as claimed in claim 7, wherein portions of the exterior surface of said support layer respectively adjoining said front end and an end opposite said front end are each provided with a self-supporting stiff reinforcing member in the form of a bar, belt, or rod extending substantially parallel to said ends.

9. The stimulable phosphor sheet as claimed in claim 7 or 8, wherein each said reinforcing member is made of a metallic material.

10. The stimulable phosphor sheet as claimed in claim 7 or 8, wherein each said reinforcing member is made of a stiff carbonaceous material.

11. The stimulable phosphor sheet as claimed in claim 7 or 8, wherein each said reinforcing member is covered with a polymer coating layer.

* * * * *